US012800689B2

(12) United States Patent
Moellers

(10) Patent No.: US 12,800,689 B2
(45) Date of Patent: Nov. 17, 2026

(54) SYSTEM AND METHOD FOR REDUCING EDDY CURRENTS IN METALLIC MATERIALS

(71) Applicant: GE Precision Healthcare LLC, Waukesha, WI (US)

(72) Inventor: Jesse John Moellers, Milwaukee, WI (US)

(73) Assignee: GE Precision Healthcare LLC, Waukesha, WI (US)

( * ) Notice: Subject to any disclaimer, the term of this patent is extended or adjusted under 35 U.S.C. 154(b) by 189 days.

(21) Appl. No.: 18/816,161

(22) Filed: Aug. 27, 2024

(65) Prior Publication Data

US 2026/0063746 A1 Mar. 5, 2026

(51) Int. Cl.

| | |
|---|---|
| ***G01V 3/00*** | (2006.01) |
| ***G01R 33/34*** | (2006.01) |
| ***G01R 33/38*** | (2006.01) |
| ***G01R 33/385*** | (2006.01) |
| ***G01R 33/565*** | (2006.01) |

(52) U.S. Cl.

CPC . *G01R 33/56518* (2013.01); *G01R 33/34007* (2013.01); *G01R 33/3804* (2013.01); *G01R 33/385* (2013.01)

(58) Field of Classification Search

CPC ........ G01R 33/56518; G01R 33/34007; G01R 33/3804; G01R 33/385

USPC .......................................................... 324/309

See application file for complete search history.

(56) References Cited

U.S. PATENT DOCUMENTS

| | | | |
|---|---|---|---|
| 4,621,299 | A | 11/1986 | Hill |
| 7,210,627 | B2 | 5/2007 | Morley, Jr. et al. |
| 7,271,591 | B1 | 9/2007 | Legall et al. |
| 7,414,401 | B1 | 8/2008 | Lvovsky |
| 9,178,369 | B2 | 11/2015 | Partovi |
| 9,645,210 | B2 | 5/2017 | McNulty et al. |
| 10,010,018 | B2 | 6/2018 | Lee et al. |

(Continued)

FOREIGN PATENT DOCUMENTS

| | | | | |
|---|---|---|---|---|
| CN | 102349119 A | * 2/2012 | ............... | H01F 5/06 |
| CN | 104375106 | 2/2015 | | |

(Continued)

OTHER PUBLICATIONS

Pyo et al. "Eddy Current Loss Reduction in Axial-Flux Motors Using 3D Printing," Energies, MDPI, 2023, 12 pgs.

(Continued)

*Primary Examiner* — Walter L Lindsay, Jr.
*Assistant Examiner* — Frederick Wenderoth
(74) *Attorney, Agent, or Firm* — Fletcher Yoder, P.C.

(57) ABSTRACT

A magnetic resonance imaging (MRI) system includes a plurality of gradient coils positioned about a bore of a magnet. The MRI system also includes a radio frequency coil assembly. The MRI system also includes an RF transceiver system and an RF switch controlled by a pulse module to transmit RF signals to the RF coil assembly to acquire MRI images of a subject within the bore. The at least one component of the MRI system is manufactured with microstructures having a braided configuration. The microstructures are configured to cancel out eddy currents that are induced in the at least one component by a magnetic field when the MRI system is utilized.

17 Claims, 6 Drawing Sheets

(56) References Cited

U.S. PATENT DOCUMENTS

| | | | |
|---|---|---|---|
| 2008/0262628 | A1 | 10/2008 | Laitenberger et al. |
| 2017/0154713 | A1 | 6/2017 | Simon et al. |

FOREIGN PATENT DOCUMENTS

| | | | | | |
|---|---|---|---|---|---|
| CN | 105566672 | A | * | 5/2016 | ................ C08J 9/26 |
| CN | 106772162 | | | 5/2017 | |
| EP | 3779764 | A1 | * | 2/2021 | ............. G06F 30/17 |
| JP | 2022109954 | | | 7/2022 | |
| JP | 2022109954 | A | * | 7/2022 | ................ B22F 1/16 |
| KR | 101399023 | | | 5/2014 | |
| WO | WO-2012113939 | A2 | * | 8/2012 | ............. A61B 5/055 |

OTHER PUBLICATIONS

Tiismus et al., "State of the art of additively manufactured electromagnetic materials for topology optimized electrical machines," Elsevier, Additive Manufacturing 55, 2022, 19 pgs.

Yang et al., "MXene-Based Porous Monoliths," nanomaterials, MDPI, 2022, 30 pgs.

* cited by examiner

SYSTEM AND METHOD FOR REDUCING EDDY CURRENTS IN METALLIC MATERIALS

BACKGROUND

The subject matter disclosed herein relates to medical imaging and, more particularly, to a system and method for reducing eddy currents in metallic materials.

Non-invasive imaging technologies allow images of the internal structures or features of a patient/object to be obtained without performing an invasive procedure on the patient/object. In particular, such non-invasive imaging technologies rely on various physical principles (such as the differential transmission of X-rays through a target volume, the reflection of acoustic waves within the volume, the paramagnetic properties of different tissues and materials within the volume, the breakdown of targeted radionuclides within the body, and so forth) to acquire data and to construct images or otherwise represent the observed internal features of the patient/object.

During MRI, when a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment, $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradient fields vary according to the particular localization method being used. The resulting set of received nuclear magnetic resonance (NMR) signals are digitized and processed to reconstruct the image using one of many well-known reconstruction techniques.

MRI requires the use of metals (e.g., copper) throughout the system. Despite being nonmagnetic, the changing magnetic field created by MRI induces eddy currents in the metal components. This results in several undesirable outcomes. First, the eddy currents disturb the magnetic field making it non-uniform. A uniform magnetic field is required for creating high quality images. Second, the eddy currents create heat which requires the system to use more energy to cool. Heat cycling can weaken surrounding parts and limits engineers to high temperature materials. Third, the eddy currents induce a cyclical force on the part slamming it back and forth leading to wear, fatigue failure, and epoxy cracks that led to high potentials which destroy systems. These forces are one of the primary reasons that MRI's are so loud.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a magnetic resonance imaging (MRI) system is provided. The MRI system includes a plurality of gradient coils positioned about a bore of a magnet. The MRI system also includes a radio frequency (RF) coil assembly. The MRI system also includes an RF transceiver system and an RF switch controlled by a pulse module to transmit RF signals to the RF coil assembly to acquire MRI images of a subject within the bore. The at least one component of the MRI system is manufactured with microstructures having a braided configuration. The microstructures are configured to cancel out eddy currents that are induced in the at least one component by a magnetic field when the MRI system is utilized.

In another embodiment, a method for reducing eddy currents is provided. The method includes utilizing a magnetic resonance imaging (MRI) system to acquire MRI mages of a subject disposed within a bore of magnet of an MR scanner, wherein the MR scanner includes a plurality of gradient coils positioned about the bore of the magnet, and the MRI system includes a radio frequency (RF) coil assembly. The method also includes canceling out, via microstructures, eddy currents that are induced in at least one component of MRI system by a magnetic field generated by the MRI system, wherein the at least one component is manufactured with the microstructures, and each microstructure of the microstructures has a braided configuration.

In a further embodiment, a method for manufacturing a component of a magnetic resonance imaging (MRI) system is provided. The method includes additively manufacturing a metal component of the MRI system with microstructures having a braided configuration, wherein the microstructures are configured to cancel out eddy currents that are induced in the metal component by a magnetic field when the MRI system is utilized.

BRIEF DESCRIPTION OF THE DRAWINGS

These and other features, aspects, and advantages of the present subject matter will become better understood when the following detailed description is read with reference to the accompanying drawings in which like characters represent like parts throughout the drawings, wherein.

DETAILED DESCRIPTION

Figure 1:
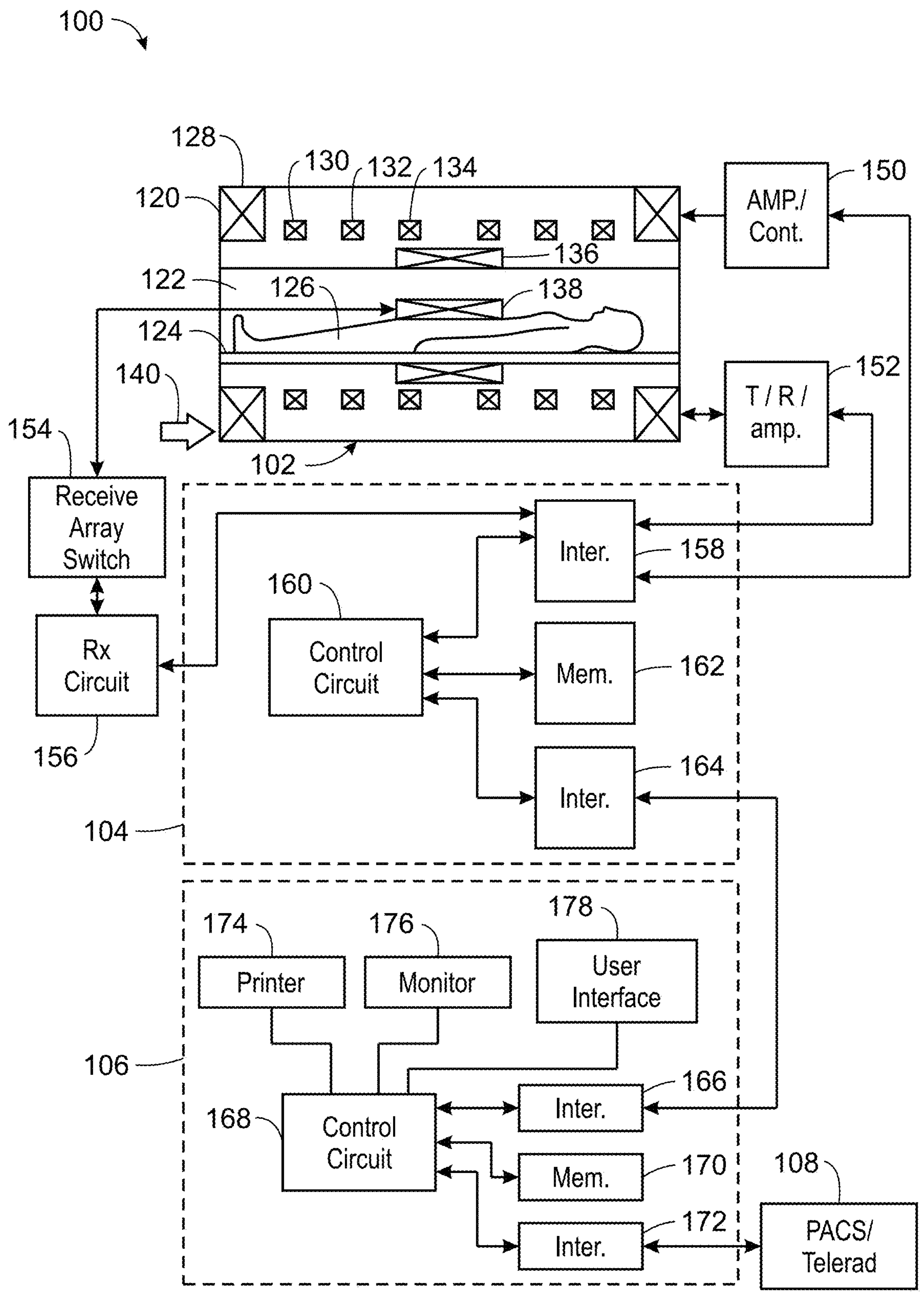
FIG. 1 illustrates an embodiment of a magnetic resonance imaging (MRI) system suitable for use with the disclosed technique.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present subject matter, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

While aspects of the following discussion are provided in the context of medical imaging, it should be appreciated that the disclosed techniques are not limited to such medical contexts. Indeed, the provision of examples and explanations in such a medical context is only to facilitate explanation by providing instances of real-world implementations and applications. However, the disclosed techniques may also be utilized in other contexts, such as image reconstruction for non-destructive inspection of manufactured parts or goods (i.e., quality control or quality review applications), and/or the non-invasive inspection of packages, boxes, luggage, and so forth (i.e., security or screening applications). In general, the disclosed techniques may be useful in any imaging or screening context or image processing or photography field where a set or type of acquired data undergoes a reconstruction process to generate an image or volume.

The present disclosure provides systems and methods for reducing eddy currents in eddy current generating materials (e.g., metallic materials). In particular, components of a magnetic resonance imaging (MRI) system are manufactured to have microstructures having a braided (e.g., twisted or interleaved) configuration. A microstructure is a structure of an object or material that is revealed by an optical microscope at a magnification greater than 25 times (e.g., on a nanometer-centimeter scale). The braid configuration of each microstructure may resemble a multi-strand braided conductor or wire. The microstructures are configured to cancel out eddy currents that are induced in the respective component by a magnetic field when the MRI system is utilized.

The disclosed embodiments enable the magnetic field to be more uniform, thus, improving image quality. The disclosed embodiments enable simplification of development to reduce the impacts of eddy currents. The disclosed embodiments reduce magnet shimming, reducing install time at a customer site. The disclosed embodiments enable a larger range of frequencies to be made available for scanning as resonance frequencies will be reduced. The disclosed embodiments reduce mechanical noise during a scan. Thus, the scanning environment will be more patient for the patient. The disclosed embodiments enable metallic components to be utilized more freely with less negative impacts. The disclosed embodiments produce less heat, thus, less energy will be need for cooling. The disclosed embodiments enable the use of lower temperature and lower cost materials around the parts manufactured with the eddy current canceling microstructures. The disclosed embodiments result in lower cyclical forces being induced on the parts. This opens the door for use of new geometries, lower cost connections/fittings, and lower cost materials with lower strengths.

It should be noted that the eddy current canceling microstructures may be utilized in other applications besides magnetic resonance imaging. For example, these eddy current canceling microstructures may be utilized in the wireless charging industry. Currently metal cannot be used on a charger at it will generate eddy currents and create heat like a stove top. Utilization of eddy current canceling microstructures enable the use of metals on or near induction charging applications. The eddy current canceling microstructures may also be utilized in defense industry. For example, the eddy current canceling microstructures may be useful for absorbing radar or other tracking technology.

The disclosed embodiments include an MRI system that includes a plurality of gradient coils positioned about a bore of a magnet. The MRI system also includes a radio frequency (RF) coil assembly. The MRI system also includes an RF transceiver system and an RF switch controlled by a pulse module to transmit RF signals to the RF coil assembly to acquire MRI images of a subject within the bore. The at least one component of the MRI system is manufactured with microstructures having a braided configuration. The microstructures are configured to cancel out eddy currents that are induced in the at least one component by a magnetic field when the MRI system is utilized.

In certain embodiments, the microstructures of the at least one component are additively manufactured. In certain embodiments, the microstructures of the at least one component are manufactured via sintering. In certain embodiments, the at least one component and its microstructures are made of metal. In certain embodiments, the at least one component includes a gradient coil of the plurality of gradient coils. In certain embodiments, wherein the at least one component includes the RF coil assembly. In certain embodiments, the MRI system includes a table configured to move the subject into and out of the bore, wherein the radio frequency coil assembly is integrated within a portion of the table. In certain embodiments, the radio frequency coil assembly is a body coil configured to be disposed on or about a portion of the subject. In certain embodiments, a cooling system for cooling the magnet, wherein the at least one component includes a component of the cooling system. In certain embodiments, each microstructure of the microstructures is oriented in a same direction. In certain embodiments, the microstructures vary in orientation.

The disclosed embodiments include a method for reducing eddy currents. The method includes utilizing a magnetic resonance imaging (MRI) system to acquire MRI mages of a subject disposed within a bore of magnet of an MR scanner, wherein the MR scanner includes a plurality of gradient coils positioned about the bore of the magnet, and the MRI system includes a radio frequency (RF) coil assembly. The method also includes canceling out, via microstructures, eddy currents that are induced in at least one component of MRI system by a magnetic field generated by the MRI system, wherein the at least one component is manufactured with the microstructures, and each microstructure of the microstructures has a braided configuration.

In certain embodiments, the microstructures of the at least one component are additively manufactured. In certain embodiments, the microstructures of the at least one component are manufactured via sintering. In certain embodiments, the at least one component and its microstructures are made of metal. In certain embodiments, the at least one component includes a gradient coil of the plurality of gradient coils. In certain embodiments, the at least one component includes the RF coil assembly. In certain embodiments, the RF coil assembly is integrated within a portion of a table configured to move the subject into and out of the bore. In certain embodiments, the RF coil assembly is a body coil configured to be disposed on or about a portion of the subject.

The disclosed embodiments include a method for manufacturing a component of a magnetic resonance imaging (MRI) system. The method includes additively manufacturing a metal component of the MRI system with microstructures having a braided configuration, wherein the microstructures are configured to cancel out eddy currents that are induced in the metal component by a magnetic field when the MRI system is utilized.

With the preceding in mind, FIG. 1 a magnetic resonance imaging (MRI) system 100 is illustrated schematically as including a scanner 102, scanner control circuitry 104, and system control circuitry 106. According to the embodiments described herein, the MRI system 100 is generally configured to perform MR imaging.

System 100 additionally includes remote access and storage systems or devices such as picture archiving and communication systems (PACS) 108, or other devices such as teleradiology equipment so that data acquired by the system 100 may be accessed on- or off-site. In this way, MR data may be acquired, followed by on- or off-site processing and evaluation. While the MRI system 100 may include any suitable scanner or detector, in the illustrated embodiment, the system 100 includes a full body scanner 102 having a housing 120 through which a bore 122 is formed. A table 124 is moveable into the bore 122 to permit a patient 126 (e.g., subject) to be positioned therein for imaging selected anatomy within the patient.

Scanner 102 includes a series of associated coils for producing controlled magnetic fields for exciting the gyromagnetic material within the anatomy of the patient being imaged. Specifically, a primary magnet coil 128 is provided for generating a primary magnetic field, $B_0$, which is generally aligned with the bore 122. A series of gradient coils 130, 132, and 134 permit controlled magnetic gradient fields to be generated for positional encoding of certain gyromagnetic nuclei within the patient 126 during examination sequences. A radio frequency (RF) coil 136 (e.g., RF transmit coil) is configured to generate radio frequency pulses for exciting the certain gyromagnetic nuclei within the patient. In addition to the coils that may be local to the scanner 102 (e.g., integrated in table 124 or other part of scanner 102), the system 100 also includes a set of receiving coils or RF receiving coils 138 (e.g., an array of coils) configured for placement proximal (e.g., against) to the patient 126. As an example, the receiving coils 138 can include cervical/thoracic/lumbar (CTL) coils, head coils, single-sided spine coils, and so forth. Generally, the receiving coils 138 are placed close to or on top of the patient 126 so as to receive the weak RF signals (weak relative to the transmitted pulses generated by the scanner coils) that are generated by certain gyromagnetic nuclei within the patient 126 as they return to their relaxed state.

The various coils of system 100 are controlled by external circuitry to generate the desired field and pulses, and to read emissions from the gyromagnetic material in a controlled manner. In the illustrated embodiment, a main power supply 140 provides power to the primary field coil 128 to generate the primary magnetic field, Bo. A power input (e.g., power from a utility or grid), a power distribution unit (PDU), a power supply (PS), and a driver circuit 150 may together provide power to pulse the gradient field coils 130, 132, and 134. The driver circuit 150 may include amplification and control circuitry for supplying current to the coils as defined by digitized pulse sequences output by the scanner control circuitry 104.

Another control circuit 152 is provided for regulating operation of the RF coil 136. Circuit 152 includes a switching device for alternating between the active and inactive modes of operation, wherein the RF coil 136 transmits and does not transmit signals, respectively. Circuit 152 also includes amplification circuitry configured to generate the RF pulses. Similarly, the receiving coils 138 are connected to switch 154, which is capable of switching the receiving coils 138 between receiving and non-receiving modes. Thus, the receiving coils 138 resonate with the RF signals produced by relaxing gyromagnetic nuclei from within the patient 126 while in the receiving mode, and they do not resonate with RF energy from the transmitting coils (i.e., coil 136) so as to prevent undesirable operation while in the non-receiving mode. Additionally, a receiving circuit 156 is configured to receive the data detected by the receiving coils 138 and may include one or more multiplexing and/or amplification circuits.

It should be noted that while the scanner 102 and the control/amplification circuitry described above are illustrated as being coupled by a single line, many such lines may be present in an actual instantiation. For example, separate lines may be used for control, data communication, power transmission, and so on. Further, suitable hardware may be disposed along each type of line for the proper handling of the data and current/voltage. Indeed, various filters, digitizers, and processors may be disposed between the scanner and either or both of the scanner and system control circuitry 104, 106.

As illustrated, scanner control circuitry 104 includes an interface circuit 158, which outputs signals for driving the gradient field coils and the RF coil and for receiving the data representative of the magnetic resonance signals produced in examination sequences. The interface circuit 158 is coupled to a control and analysis circuit 160. The control and analysis circuit 160 executes the commands for driving the circuit 150 and circuit 152 based on defined protocols selected via system control circuit 106.

Control and analysis circuit 160 also serves to receive the magnetic resonance signals and performs subsequent processing before transmitting the data to system control circuit 106. Scanner control circuit 104 also includes one or more memory circuits 162, which store configuration parameters, pulse sequence descriptions, examination results, and so forth, during operation.

Interface circuit 164 is coupled to the control and analysis circuit 160 for exchanging data between scanner control circuitry 104 and system control circuitry 106. In certain embodiments, the control and analysis circuit 160, while illustrated as a single unit, may include one or more hardware devices. The system control circuit 106 includes an interface circuit 166, which receives data from the scanner control circuitry 104 and transmits data and commands back to the scanner control circuitry 104. The control and analysis circuit 168 may include a CPU in a multi-purpose or application specific computer or workstation. Control and analysis circuit 168 is coupled to a memory circuit 170 to store programming code for operation of the MRI system 100 and to store the processed image data for later reconstruction, display and transmission. The programming code may execute one or more algorithms that, when executed by a processor, are configured to perform reconstruction of acquired data as described below. In certain embodiments, the memory circuit 170 may store one or more neural networks for reconstruction of acquired data as described below. In certain embodiments, image reconstruction may occur on a separate computing device having processing circuitry and memory circuitry.

An additional interface circuit 172 may be provided for exchanging image data, configuration parameters, and so forth with external system components such as remote access and storage devices 108. Finally, the system control and analysis circuit 168 may be communicatively coupled to various peripheral devices for facilitating operator interface and for producing hard copies of the reconstructed images. In the illustrated embodiment, these peripherals include a printer 174, a monitor 176, and user interface 178 including devices such as a keyboard, a mouse, a touchscreen (e.g., integrated with the monitor 176), and so forth.

Figure 2:
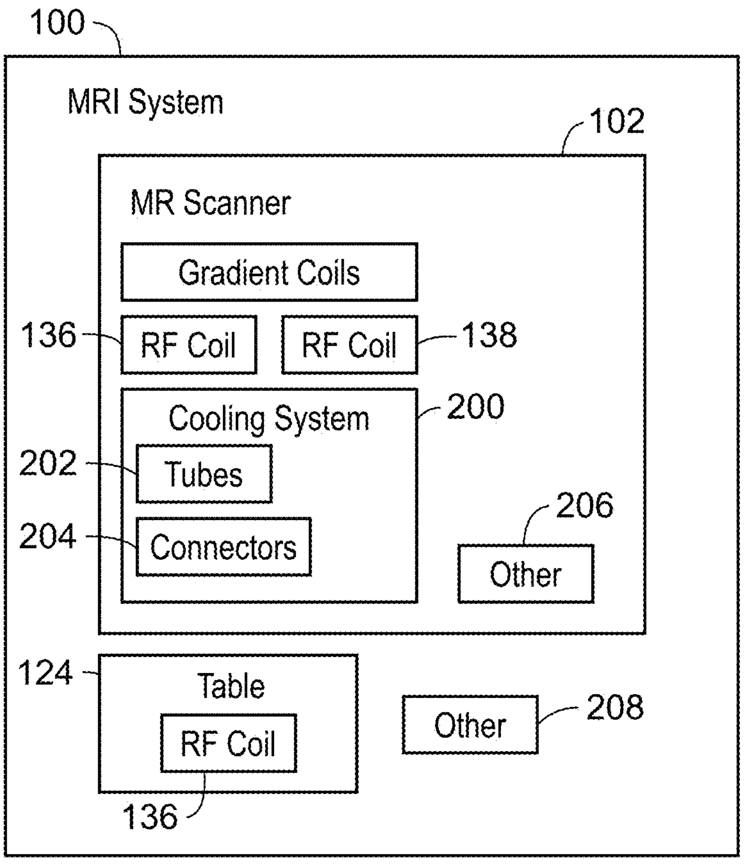
FIG. 2 is a schematic diagram illustrating components of the MRI system in FIG. 1 that may be manufactured with microstructures, in accordance with aspects of the present disclosure.

FIG. 2 is a schematic diagram illustrating components of the MRI system 100 in FIG. 1 that may be manufactured with microstructures (e.g., eddy current canceling microstructures). These components are non-limiting examples of components that may be manufactured with eddy current canceling microstructures. Other components of the MRI system 100 may be manufactured with eddy current canceling microstructures. As noted above, a microstructure is a structure of an object or material that is revealed by an optical microscope at a magnification greater than 25 times (e.g., on a nanometer-centimeter scale). One or more of the components may be manufactured with eddy current canceling structures. In certain embodiments, an entirety of the component may be manufactured with eddy current canceling microstructures. In certain embodiments, one or more portions of the component may be manufactured with eddy current canceling microstructures. In certain embodiments, an entirety of the component or one or more portions of the component are made of a material that generates eddy currents (e.g., in response to a magnetic field generated by the MRI system 100 when utilized). In certain embodiments, an entirety of the component or one or more portions of the component are made of a metal. For example, an entirety of the component or one or more portions of the component are made of copper.

The component with the eddy current canceling microstructures may be manufactured utilizing a variety of techniques. For example, the component with the eddy current canceling microstructures may be additively manufactured (e.g., via three-dimensional (3D) printing). For example, laser powder bed fusion (LPBF) may be utilized. In certain embodiments, the component with the eddy current canceling microstructures may be made via sintering. For example, powder (e.g., metal powder) may be added into a mold and an epoxy (e.g., binder) added and then the sintering process is carried out. Other manufacturing techniques may be utilized to manufacture components with eddy current canceling microstructures.

Each of the eddy current canceling microstructures has a braided (e.g., twisted or interleaved) configuration similar to a multi-strand braided conductor or wire. The braided configuration minimizes or cancels out eddy current generated by the material of the component. In certain embodiments, the arrangement of the microstructures may vary. In certain embodiments, a single microstructure extends along an entire respective length of a component (e.g., wall or tube) at a particular position. In certain embodiments, multiple microstructures (e.g., segmented microstructures) extend along an entire respective length of a component at a particular location. In certain embodiments, each microstructure of the microstructures is oriented in a same direction. In certain embodiments, the microstructures vary in orientation. In certain embodiments, the microstructures vary in length. In certain embodiments, the microstructure have the same length. In certain embodiments, the microstructures vary in in width. In certain embodiments, the microstructures have the same width. In certain embodiments, the microstructures vary in shape. In certain embodiments, the microstructures have the same shape.

As mentioned above, one or more components of MRI system 100 are manufactured with eddy current canceling microstructures (with each microstructure having a braided configuration). In certain embodiments, one or more components of the MR scanner 102 are manufactured with the eddy current canceling microstructures. In certain embodiments, one or more gradient coils are manufactured with the eddy current canceling microstructures. In certain embodiments, one or more RF coils 136 that are integrated within the MR scanner 102 are manufactured with the eddy current canceling microstructures. In certain embodiments, one or more RF coils 138 (e.g., body coils) configured to be disposed on or about subjects for imaging are manufactured with the eddy current canceling microstructures. In certain embodiments, one or more components of a cooling system 200 (e.g., for cooling the magnet) are manufactured with the eddy current canceling microstructures. For example, tubes 202 and/or connectors 204 of the cooling system 200 are manufactured with the eddy current canceling microstructures. In certain embodiments, one or more other components 206 of the MR scanner 102 are manufactured with the eddy current canceling microstructures. In certain embodiments, portions of the table 124 are manufactured with the eddy current canceling microstructures. For example, one or more RF coils 136 integrated within the table are manufactured with the eddy current canceling microstructures. In certain embodiments, other components 208 of the MRI system are manufactured with eddy current canceling microstructures.

Figure 3:
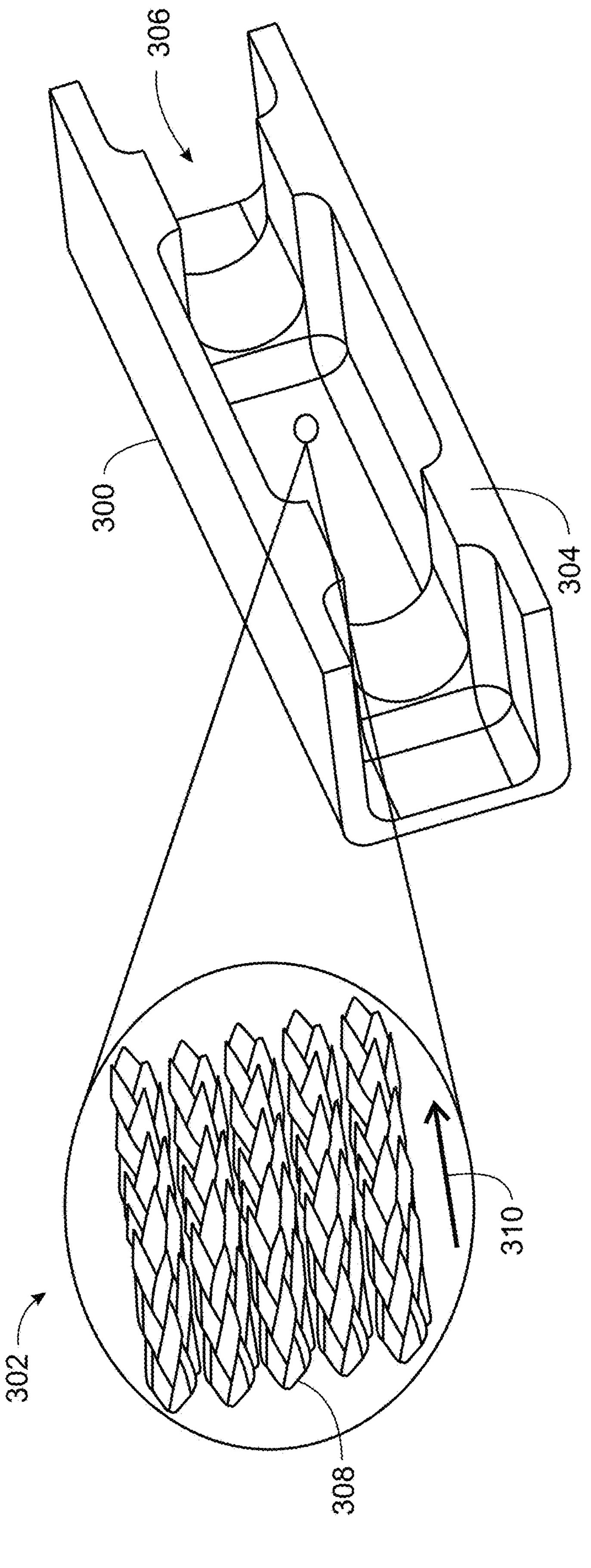
FIG. 3 is a schematic diagram of a connector piece of a cooling system of the MRI system of FIG. 1 and a magnified view of a surface of the connector piece, in accordance with aspects of the present disclosure.

FIG. 3 is a schematic diagram of a connector piece 300 of the cooling system 200 in FIG. 2 of the MRI system of FIG. 1 and a magnified view 302 of a surface 304 of the connector piece 300. The connector piece 300 includes cooling tubes 306. The connector piece 300 is additively manufactured with eddy current canceling microstructures 308. The magnified view 302 of the surface 304 depicts a plurality of the eddy current canceling microstructures 308. Each microstructure 308 has a braided (e.g., twisted or interleaved) configuration similar to a multi-strand braided conductor or wire. The braided configuration minimizes or cancels out eddy current generated by the material of the connector piece 300. As depicted, the microstructures 308 are in a parallel arrangement. Each microstructure 308 of the microstructures 308 is oriented in a same direction 310.

Figure 4:
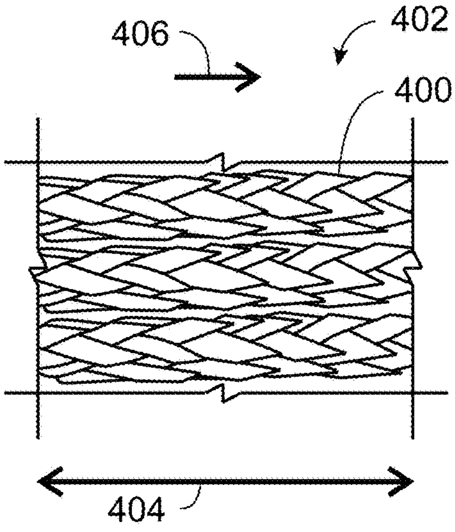
FIG. 4 is a schematic diagram of microstructures on a portion of a component of the MRI system in FIG. 1 (e.g., extending entire length at their respective positions), in accordance with aspects of the present disclosure.

FIG. 4 is a schematic diagram of microstructures 400 on a portion of a component 402 of the MRI system 100 in FIG. 1 (e.g., extending entire length at their respective positions). Each microstructure 400 extends an entire length 404 of the portion (e.g., wall) in a direction 406 at their respective positions.

Figure 5:
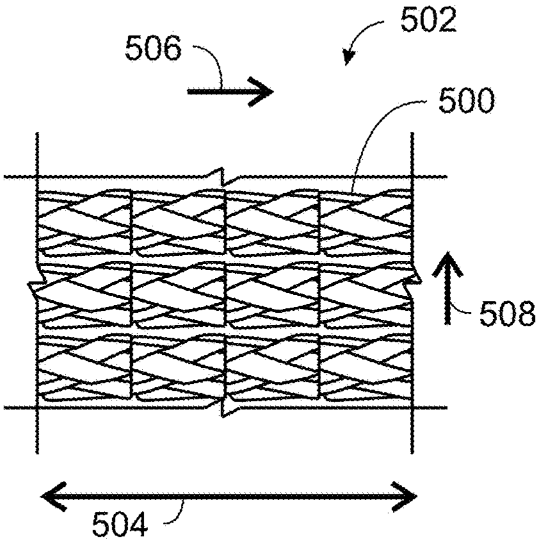
FIG. 5 is a schematic diagram of microstructures on a portion of a component of the MRI system in FIG. 1 (e.g., microstructure segments), in accordance with aspects of the present disclosure.

FIG. 5 is a schematic diagram of microstructures 500 on a portion of a component 502 of the MRI system 100 in FIG. 1 (e.g., microstructure segments). Multiple microstructures 500 extend an entire length 504 of the portion (e.g., wall) in a direction 506 at respective locations disposed along direction 508.

Figure 6:
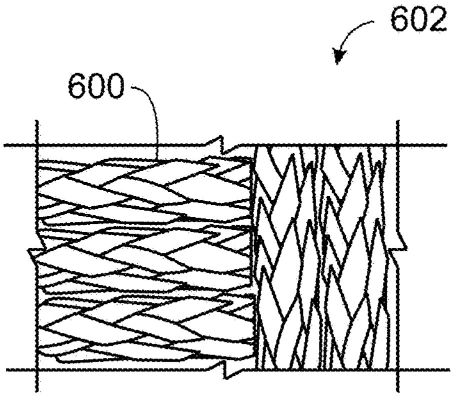
FIG. 6 is a schematic diagram of microstructures on a portion of a component of the MRI system in FIG. 1 (e.g., having varying orientations), in accordance with aspects of the present disclosure.

FIG. 6 is a schematic diagram of microstructures 600 on a portion of a component 602 of the MRI system 100 in FIG. 1 (e.g., having varying orientations). Some of the microstructures 600 on the portion of the component 602 are oriented horizontally. Some of the microstructures 600 on the portion of the component 602 are oriented vertically. In certain embodiments, some of the microstructures 600 may be angled. In certain embodiments, some of the microstructures 600 may curve.

Figure 7:
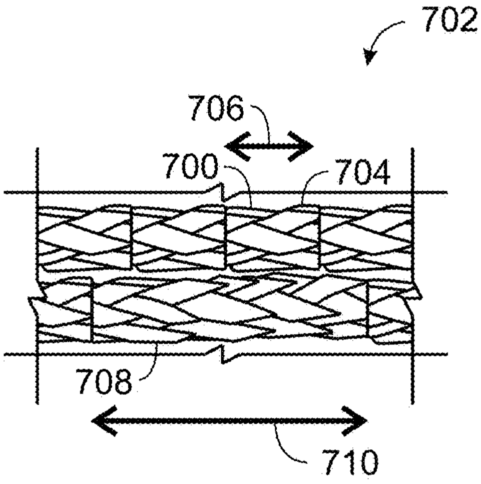
FIG. 7 is a schematic diagram of microstructures on a portion of a component of the MRI system in FIG. 1 (e.g., having varying lengths), in accordance with aspects of the present disclosure.

FIG. 7 is a schematic diagram of microstructures 700 on a portion of a component 702 of the MRI system 100 in FIG. 1 (e.g., having varying lengths). Microstructure 704 has a first length 706. Microstructure 708 has a second length 708 that is different from the first length 706.

Figure 8:
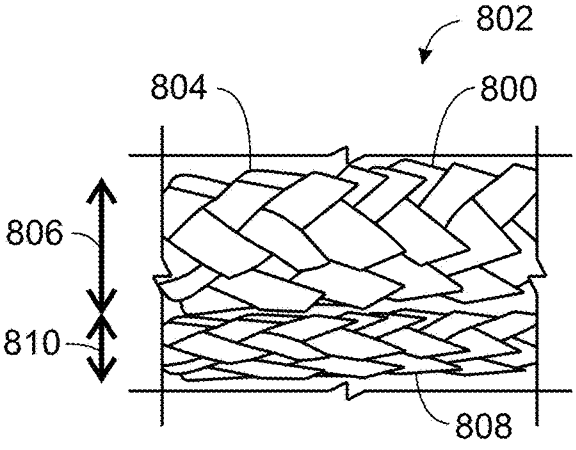
FIG. 8 is a schematic diagram of microstructures on a portion of a component of the MRI system in FIG. 1 (e.g., having varying widths), in accordance with aspects of the present disclosure.

FIG. 8 is a schematic diagram of microstructures 800 on a portion of a component 802 of the MRI system 100 in FIG. 1 (e.g., having varying widths). Microstructure 804 has a first width 806. Microstructure 808 has a second width 810 that is different from the first width 806.

Figure 9:
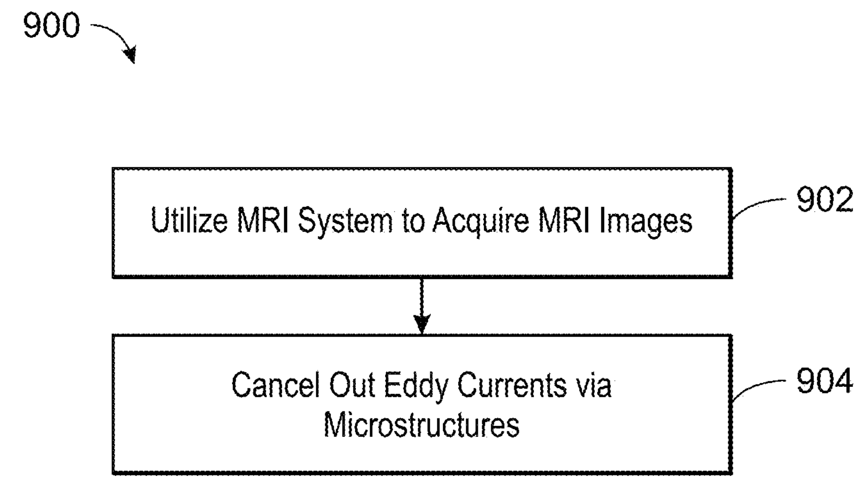
FIG. 9 is a flow chart of a method for reducing eddy currents, in accordance with aspects of the present disclosure.

FIG. 9 illustrates a flow chart of a method 900 for reducing eddy currents. One or more steps of the method 244 may be performed by processing circuitry of the magnetic resonance imaging system 100 in FIG. 1.

The method 900 includes utilizing a magnetic resonance imaging (MRI) system (e.g., MRI system 100 in FIG. 1) to acquire MRI mages of a subject disposed within a bore of magnet of an MR scanner (block 902). The MR scanner includes a plurality of gradient coils positioned about the bore of the magnet, and the MRI system comprises a radio frequency (RF) coil assembly. The method 900 also includes canceling out, via microstructures, eddy currents that are induced in at least one component of MRI system by a magnetic field generated by the MRI system, wherein the at least one component is manufactured with the microstructures, and each microstructure of the microstructures has a braided configuration.

Figure 10:
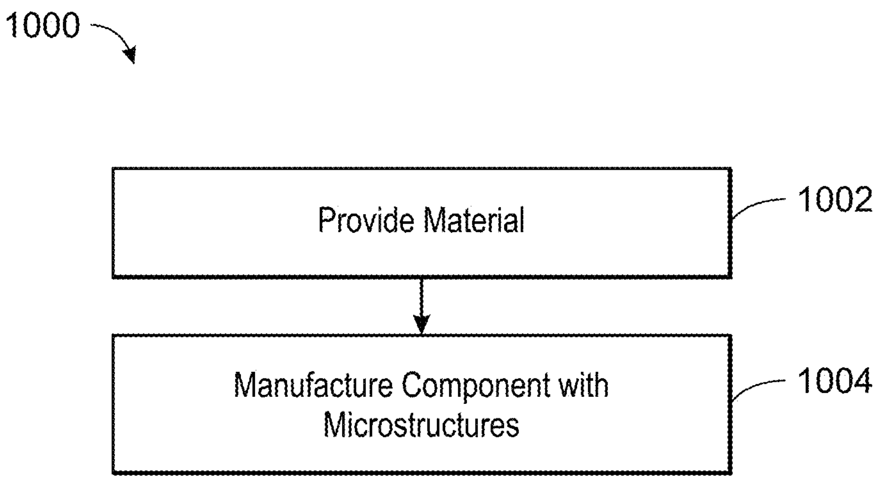
FIG. 10 is a flow chart of method for manufacturing a component of the MRI system 100 in FIG. 1, in accordance with aspects of the present disclosure.

FIG. 10 is a flow chart of method 1000 for manufacturing a component of the MRI system 100 in FIG. 1. The method 1000 includes providing material (e.g., metal) for manufacturing a component (e.g., metal component) of the MRI system (block 1002). The method 1000 also includes manufacturing the component of the MRI system with microstructures having a braided configuration, wherein the microstructures are configured to cancel out eddy currents that are induced in the component by a magnetic field when the MRI system is utilized (block 1004). For example, the component with the eddy current canceling microstructures may be additively manufactured (e.g., via three-dimensional (3D) printing). For example, laser powder bed fusion (LPBF) may be utilized. In certain embodiments, the component with the eddy current canceling microstructures may be made via sintering. For example, powder (e.g., metal powder) may be added into a mold and an epoxy (e.g., binder) added and then the sintering process is carried out. Other manufacturing techniques may be utilized to manufacture components with eddy current canceling microstructures.

Figure 11:
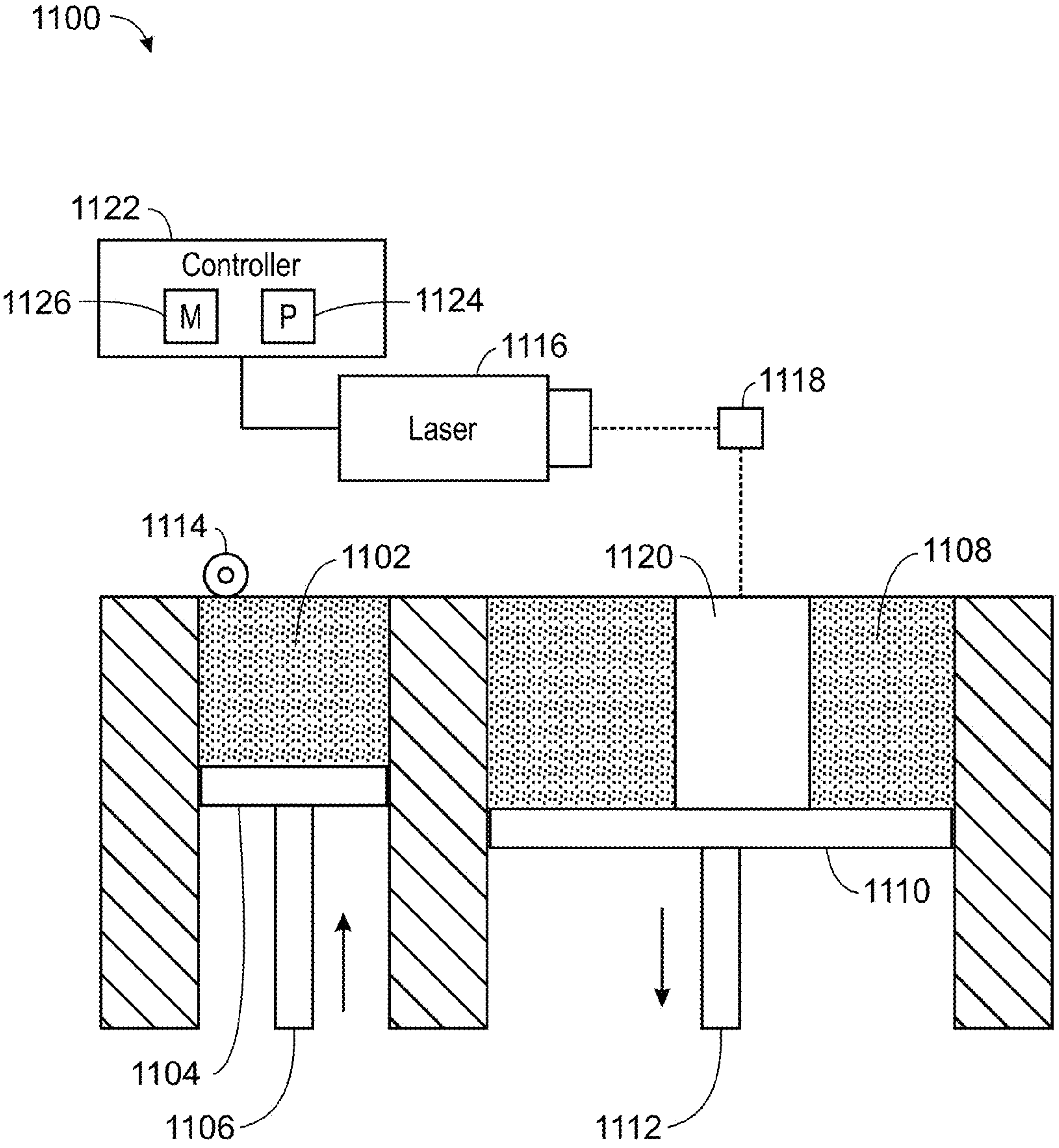
FIG. 11 depicts schematically a laser powder bed fusion system for a component of the MRI system in FIG. 1 having microstructures, in accordance with aspects of the present disclosure.

As mentioned above, the component with the eddy current canceling microstructures may be 3D printed utilizing LPBF. LPBF is also known as direct metal laser sintering (DMLS), selective laser melting (SLM) or direct metal printing (DMP). FIG. 11 depicts schematically an LPBF system 1100 for printing the component with the eddy current canceling microstructures. The LPBF system 1100 includes a metal powder stock 1102 (e.g., of tungsten powder) located on a powder platform 1104 coupled to a piston 1106. The LPBF system 1100 also includes a powder bed 1108 (e.g. having tungsten powder) located on a build platform 1110 coupled to a piston 1112. The LPBF system 1100 further includes a powder roller 1114 to transfer (e.g., spread) powder from the powder stock 1102 to the powder bed 1108 in between the formation of the layers of the component with the eddy current canceling microstructures. The LPBF system 1100 still further includes a laser 1116 that may direct a laser via mirror 1118 or directly onto powder bed 1108 to form the component 1120 with the eddy current canceling microstructures.

The LPBF system 1100 still further includes a controller 1122 coupled to the laser 1116. The controller 1122 includes include a processor 1124 (e.g., processing circuitry) and memory 1126 (e.g., memory circuitry). The processor 1124 may include multiple microprocessors, one or more "general-purpose" microprocessors, one or more special-purpose microprocessors, and/or one or more application specific integrated circuits (ASICS), system-on-chip (SoC) device, or some other processor configuration. For example, the processor 1124 may include one or more reduced instruction set (RISC) processors or complex instruction set (CISC) processors. The processor 1124 may execute instructions to carry out the various zig-zag printing strategies as described above to form the walls or septa of the collimator. These instructions may be encoded in programs or code stored in a tangible non-transitory computer-readable medium (e.g., an optical disc, solid state device, chip, firmware, etc.) such as the memory 1126. The controller 1122 controls the operation of the laser 1116 and the LPBF system 1100.

To form the component 1120 with the eddy current canceling microstructures, a layer of powder (e.g., tungsten powder) is spread over the build platform 1110 (e.g., via the powder roller 1114). The laser 1116 fuses this first layer of the component 1120. A new layer of powder is then spread across the previous layer (e.g., via the powder roller 1114) and a further layer is fused and added on the initial layer. This process repeats until the entire component is formed. Then the loose, unfused powder is removed during post-processing.

Technical effects of the disclosed subject matter include enabling the magnetic field to be more uniform, thus, improving image quality. Technical effects of the disclosed subject matter include enabling simplification of development to reduce the impacts of eddy currents. Technical effects of the disclosed subject matter include reducing magnet shimming, reducing install time at a customer site. Technical effects of the disclosed subject matter include enabling a larger range of frequencies to be made available for scanning as resonance frequencies will be reduced. Technical effects of the disclosed subject matter include reducing mechanical noise during a scan. Thus, the scanning environment will be more patient for the patient. Technical effects of the disclosed subject matter include enabling metallic components to be utilized more freely with less negative impacts. Technical effects of the disclosed subject matter include producing less heat, thus, less energy will be need for cooling. Technical effects of the disclosed subject matter include enabling the use of lower temperature and lower cost materials around the parts manufactured with the eddy current canceling microstructures. Technical effects of the disclosed subject matter include resulting in lower cyclical forces being induced on the parts. This opens the door for use of new geometries, lower cost connections/fittings, and lower cost materials with lower strengths.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The disclosure also provides support for magnetic resonance imaging (MRI) system, comprising: a plurality of gradient coils positioned about a bore of a magnet; a radio frequency (RF) coil assembly; and an RF transceiver system and an RF switch controlled by a pulse module to transmit RF signals to the RF coil assembly to acquire MRI images of a subject within the bore, wherein at least one component of the MRI system is manufactured with microstructures having a braided configuration, and the microstructures are configured to cancel out eddy currents that are induced in the at least one component by a magnetic field when the MRI system is utilized. In a first example of the MRI system, the microstructures of the at least one component are additively manufactured. In a second example of the MRI system, optionally including the first example, the microstructures of the at least one component are manufactured via sintering. In a third example of the MRI system, optionally including one or both of the first and second examples, the at least one component and its microstructures are made of metal. In a fourth example of the MRI system, optionally including one or more or each of the first through third examples, the at least one component comprises a gradient coil of the plurality of gradient coils. In a fifth example of the MRI system, optionally including one or more or each of the first through fourth examples, the at least one component comprises the RF coil assembly. In a sixth example of the MRI system, optionally including one or more or each of the first through fifth examples, the MRI system further comprises a table configured to move the subject into and out of the bore, wherein the radio frequency coil assembly is integrated within a portion of the table. In a seventh example of the MRI system, optionally including one or more or each of the first through sixth examples, the radio frequency coil assembly is a body coil configured to be disposed on or about a portion of the subject. In an eighth example of the MRI system, optionally including one or more or each of the first through seventh examples, the MRI system further comprises a cooling system for cooling the magnet, wherein the at least one component comprises a component of the cooling system. In a ninth example of the MRI system, optionally including one or more or each of the first through eighth examples, each microstructure of the microstructures is oriented in a same direction. In a tenth example of the MRI system, optionally including one or more or each of the first through ninth examples, the microstructures vary in orientation.

The disclosure also provides support for a method for reducing eddy currents, comprising: utilizing a magnetic resonance imaging (MRI) system to acquire MRI mages of a subject disposed within a bore of magnet of an MR scanner, wherein the MR scanner comprises a plurality of gradient coils positioned about the bore of the magnet, and the MRI system comprises a radio frequency (RF) coil assembly; and canceling out, via microstructures, eddy currents that are induced in at least one component of MRI system by a magnetic field generated by the MRI system, wherein the at least one component is manufactured with the microstructures, and each microstructure of the microstructures has a braided configuration. In a first example of the method, the microstructures of the at least one component are additively manufactured. In a second example of the method, optionally including the first example, the microstructures of the at least one component are manufactured via sintering. In a third example of the method, optionally including one or both of the first and second examples, the at least one component and its microstructures are made of metal. In a fourth example of the method, optionally including one or more or each of the first through third examples, the at least one component comprises a gradient coil of the plurality of gradient coils. In a fifth example of the method, optionally including one or more or each of the first through fourth examples, the at least one component comprises the RF coil assembly. In a sixth example of the method, optionally including one or more or each of the first through fifth examples, the RF coil assembly is integrated within a portion of a table configured to move the subject into and out of the bore. In a seventh example of the method, optionally including one or more or each of the first through sixth examples, the RF coil assembly is a body coil configured to be disposed on or about a portion of the subject.

The disclosure also provides support for a method for manufacturing a component of a magnetic resonance imaging (MRI) system, comprising: additively manufacturing a metal component of the MRI system with microstructures having a braided configuration, wherein the microstructures are configured to cancel out eddy currents that are induced in the metal component by a magnetic field when the MRI system is utilized.

This written description uses examples to disclose the present subject matter, including the best mode, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance imaging (MRI) system, comprising:

a plurality of gradient coils positioned about a bore of a magnet;

a radio frequency (RF) coil assembly; and an RF transceiver system and an RF switch controlled by a pulse module to transmit RF signals to the RF coil assembly to acquire MRI images of a subject within the bore, wherein at least one component of the MRI system is manufactured with microstructures having a braided configuration, and the microstructures are configured to cancel out eddy currents that are induced in the at least one component by a magnetic field when the MRI system is utilized, wherein the at least one component comprises a gradient coil of the plurality of gradient coils.

2. A method for reducing eddy currents, comprising:

utilizing a magnetic resonance imaging (MRI) system to acquire MRI images of a subject disposed within a bore of magnet of an MR scanner, wherein the MR scanner comprises a plurality of gradient coils positioned about the bore of the magnet, and the MRI system comprises a radio frequency (RF) coil assembly; and canceling out, via microstructures, eddy currents that are induced in at least one component of MRI system by a magnetic field generated by the MRI system, wherein the at least one component is manufactured with the microstructures, and each microstructure of the microstructures has a braided configuration, wherein the at least one component comprises the RF coil assembly.

3. A method for manufacturing a component of a magnetic resonance imaging (MRI) system, comprising:

additively manufacturing a metal component of the MRI system with microstructures having a braided configuration, wherein the microstructures are configured to cancel out eddy currents that are induced in the metal component by a magnetic field when the MRI system is utilized, wherein the metal component comprises a gradient coil.

4. A magnetic resonance imaging (MRI) system, comprising:

a plurality of gradient coils positioned about a bore of a magnet;

a radio frequency (RF) coil assembly; and an RF transceiver system and an RF switch controlled by a pulse module to transmit RF signals to the RF coil assembly to acquire MRI images of a subject within the bore, wherein at least one component of the MRI system is manufactured with microstructures having a braided configuration, and the microstructures are configured to cancel out eddy currents that are induced in the at least one component by a magnetic field when the MRI system is utilized, wherein the at least one component comprises the RF coil assembly.

5. A method for reducing eddy currents, comprising:

utilizing a magnetic resonance imaging (MRI) system to acquire MRI images of a subject disposed within a bore of magnet of an MR scanner, wherein the MR scanner comprises a plurality of gradient coils positioned about the bore of the magnet, and the MRI system comprises a radio frequency (RF) coil assembly; and canceling out, via microstructures, eddy currents that are induced in at least one component of MRI system by a magnetic field generated by the MRI system, wherein the at least one component is manufactured with the microstructures, and each microstructure of the microstructures has a braided configuration, wherein the at least one component comprises a gradient coil of the plurality of gradient coils.

6. The MRI system of claim 1, wherein the microstructures of the at least one component are additively manufactured.

7. The MRI system of claim 1, wherein the microstructures of the at least one component are manufactured via sintering.

8. The MRI system of claim 1, wherein the at least one component and its microstructures are made of metal.

9. The MRI system of claim 1, wherein each microstructure of the microstructures is oriented in a same direction.

10. The MRI system of claim 1, wherein the microstructures vary in orientation.

11. The method of claim 2, wherein the microstructures of the at least one component are additively manufactured.

12. The method of claim 2, wherein the microstructures of the at least one component are manufactured via sintering.

13. The method of claim 2, wherein the at least one component and its microstructures are made of metal.

14. The method of claim 2, wherein the RF coil assembly is integrated within a portion of a table configured to move the subject into and out of the bore.

15. The method of claim 2, wherein the RF coil assembly is a body coil configured to be disposed on or about a portion of the subject.

16. The MRI system of claim 4, further comprising a table configured to move the subject into and out of the bore, wherein the RF coil assembly is integrated within a portion of the table.

17. The MRI system of claim 4, wherein the RF coil assembly is a body coil configured to be disposed on or about a portion of the subject.

* * * * *